US006614095B1

(12) United States Patent
Adamschik et al.

(10) Patent No.: US 6,614,095 B1
(45) Date of Patent: Sep. 2, 2003

(54) DIAMOND COMPONENT WITH REAR SIDE CONTACT AND A METHOD FOR THE PRODUCTION THEREOF

(75) Inventors: Mario Adamschik, Ulm (DE); Erhard Kohn, Ulm (DE); Peter Gluche, Ulm (DE); Alexander Kaiser, Assmannshardt (DE)

(73) Assignee: GFD-Gesellschaft fur Diamantprodukte mbH (DE)

( * ) Notice: Subject to any disclaimer, the term of this patent is extended or adjusted under 35 U.S.C. 154(b) by 0 days.

(21) Appl. No.: 09/701,924

(22) PCT Filed: Jun. 4, 1999

(86) PCT No.: PCT/EP99/03878

§ 371 (c)(1),
(2), (4) Date: Feb. 2, 2001

(87) PCT Pub. No.: WO99/63596

PCT Pub. Date: Dec. 9, 1999

(30) Foreign Application Priority Data

Jun. 4, 1998 (DE) .......................................... 198 24 894

(51) Int. Cl.$^7$ ............................................... H01L 29/40
(52) U.S. Cl. ......................... 257/621; 257/76; 257/77; 257/414; 257/95; 257/98
(58) Field of Search ............................ 257/621, 76, 77, 257/414, 95, 98, 99, 103

(56) References Cited

U.S. PATENT DOCUMENTS

| 4,668,374 A | * | 5/1987 | Bhagat et al. ............... 204/412 |
| 4,893,174 A | * | 1/1990 | Yamada et al. ............... 357/82 |
| 4,954,875 A | | 9/1990 | Clements ..................... 357/75 |
| 4,961,833 A | * | 10/1990 | Sakai et al. .................. 204/403 |
| 5,122,856 A | | 6/1992 | Komiya ........................ 357/55 |
| 5,362,975 A | | 11/1994 | von Windheim et al. |
| 5,414,284 A | * | 5/1995 | Baxter et al. ................ 257/253 |
| 5,737,052 A | * | 4/1998 | Kimura ........................ 349/149 |
| 5,905,275 A | * | 5/1999 | Nunoue et al. ............... 257/95 |

FOREIGN PATENT DOCUMENTS

JP 56029130 A * 3/1981

OTHER PUBLICATIONS

Wur D.R. et al., "Polycrystalline Diamond Pressure Sensor," Journal of Microelectromechanical Systems, Mar. 1995, pp. 34–41.
Deguchi et al., "Piezoresistive properties of chemical vapor deposited p–type diamonds strain gauges fabricated on diaphragm structure," Diamond and Related Structure, May 1, 1996, pp. 728–731.
Kohn et al., Electronic and Sensor Applications of Semi–Conducting CVD Diamond Films, Proceedings of the fifth international symposium on Diamond Materials, Paris, Sep. 1997, pp. 482–490.
Nastasi U. et al, "CVD diamond tips as X–ray detectors," Diamond and Related Materials, Feb. 1, 1998, pp. 523–527.

* cited by examiner

Primary Examiner—Nathan J. Flynn
Assistant Examiner—Remmon R. Fordé
(74) Attorney, Agent, or Firm—Young & Basile, P.C.

(57) ABSTRACT

The invention relates to a component which has a function element arranged on a substrate the function element being electrically contacted in a contact region on its rear side facing the substrate. The substrate has an opening in the contact region and the rear side of the function element is coated with a contact metal.

21 Claims, 3 Drawing Sheets

DIAMOND COMPONENT WITH REAR SIDE CONTACT AND A METHOD FOR THE PRODUCTION THEREOF

BACKGROUND OF THE INVENTION

The invention relates to a component with a rear side contact and to a method for manufacturing same. Components of this type are used for example as sensors, actuators, active components, transistors, diodes, capacitors, resistors and the like, in particular for sensors which are resistant to high temperatures or to chemicals, radiation or magnetic fields. Actuators or sensors of this kind can be used in particular in the field of medical technology.

Conventionally, components of this type are contacted on the rear side by means of electrical through connection technology (via-hole technology). This technology is described for example in Heinz Beneking, Halbleiter Technologie (=semiconductor technology) B. G. Teubner-Verlag Stuttgart, 1991 and is used mainly in MMIC (Monolithic Microwave Integrated Circuits) technology. These are high-frequency ICs in which the rear side of the substrate represents an earth surface, i.e. the rear side of the IC is completely metallised. To the front side of the substrate are attached the components (resistors, transistors and the like), and additional non-sheathed cables. In order to realise an electrical earth connection of the components from the front to the rear side, through-holes are introduced into the substrate, the flanks of which holes are covered with metal. Thus the metallisation of the hole is accessible from the front side and from the rear side and can be connected on the front side to the components and on the rear side to the earth. What is disadvantageous about this is that not only is the rear side of the substrate partially coated with metal but also the function element itself consists of chemically reactive material. As a rule, the function element consists of an electronic or optoelectronic structure formed from semiconductor material such as GaAs. This semiconductor material is largely chemically reactive (and corrodes for example) and must be passivated (e.g. with $SiO_2$ or $Si_3N_4$), which in turn makes very high demands of passivation technology.

Via-hole technology is therefore substantially limited to electronic/optoelectronic components.

SUMMARY OF THE INVENTION

The object of the present invention is to make available a component and a method for manufacturing same, which renders possible an electrical rear side contact whilst simultaneously preserving an inert component surface.

According to the invention, the component is produced by an electrically conductive layer being deposited on a substrate on the front side in the region of a future contact region and thereafter possibly additional layers being applied to form the function element. Then in the area of the contact region, the substrate is removed, starting from the rear side of the substrate, for example by a physical or chemical etching method, at least down to the electrically conductive layer and the recess so formed is metallised. Thus a component is produced which has no through-hole at the contact location and is consequently only metallised on the rear side. This renders possible a high radiological, chemical and physical resistance of the surface of the component since the metallic contact on the rear side is completely covered on the front side. Noble metal, base metal or even an alloy can therefore be used without taking into account the requirements made of the upper side of the component. Consequently an electrical rear side contact is produced whilst preserving the component surface. The physical, chemical and/or mechanical properties of the surface can therefore be completely exploited since the latter is freely available and not limited by metallised through-holes,. Thus additional diamond layers can also be applied to the surface of the component. With a complete diamond coating of the front side of the component, the excellent chemical, physical, electrical thermal and/or mechanical surface properties of the diamond can be exploited.

The electrically conductive layer can also be applied already as a conductive doped diamond layer, for example with a boron doping. The doping can here be designed in a variable manner in both vertical and horizontal directions, according to which component with the diamond coating is to be constructed on the front side of the substrate.

As the substrate can be used, for example, silicon, quartz, glass or even free-standing diamond. Non-doped diamond here has the advantages that it is completely non-conductive, such that it is possible to dispense with insulation between the diamond substrate and electrically conductive layers of the function element or of the contact metallisation. This saves further steps in the manufacturing process such that production is simplified overall. In this case the diamond substrate can also be produced as one piece with the function element, which can also be constructed from diamond layers.

Where silicon is used as the substrate it is necessary to insert an electrically insulating layer between the substrate and the electrically conductive layer of the function element and also between the substrate and the metallic rear side contact. This can be deposited for example as silicon oxide or silicon nitride or can be produced by oxidation of the silicon substrate to form silicon oxide.

Advantages about the use of diamond for the function element or for the complete coating of the front side of the component is in particular the fact that the diamond is resistant to high temperatures, completely non-conductive and chemically inert and has great hardness. Furthermore, a component with a diamond coating on the front side is suitable as a detector material for corpuscular radiation or high-energy X-rays since it is completely resistant to radiology. In particular it has no self-heating. The metal layers which are sensitive to radiation are then located protected merely on the rear side of the component.

The components according to the invention can be used as sensors, actuators, active components, transistors, diodes, capacitors, resistors and the like. As a result of their high stability they are particularly suitable as sensors, for example for pressure, impedance, temperature, in particular as sensors which are resistant to chemicals, corpuscular radiation, X-rays, high temperatures and/or magnetic fields. They can therefore be used in the field of medical technology, such as for example NMR tomography and also for instruments of micro-invasive surgery. There, for example, they can be used in catheters, which have to be completely sealed with respect to the human organism, in order to achieve high biomedical compatibility. This requires also the here guaranteed complete absence of chemically reactive elements such as e.g. metals on the catheter surface which comes into contact with the patient's body.

By providing contact on both sides of the diamond layers by means of metallisation, in addition to the above-mentioned applications vertical structures and components such as e.g. back-gate transistors, photodiodes, photoconductors etc. can be realised. In addition, pn-diodes can be produced by epitaxial diamond layers with differing doping.

Diamond layers can be deposited and doped for example on silicon substrates over the entire surface in layer thicknesses of between several μm and several mm. The deposition is usually carried out through the use of plasma-supported or hot wire methods. Selective depositions is here possible with the aid of $SiO_2$ as the mask material. The layers so produced have, by comparison with natural diamonds, roughly identical mechanical, chemical and physical properties.

The removal of the substrate in the contact region can be effected by means of conventional etching methods. For example, dry or wet chemical etching or even physical etching is available for this purpose.

The definition of all the structures is achieved by means of known lithographic methods such as are usual in microsystem technology.

Some components are described by way of example in what follows.

DESCRIPTION OF THE PREFERRED EMBODIMENT

Figure 1:
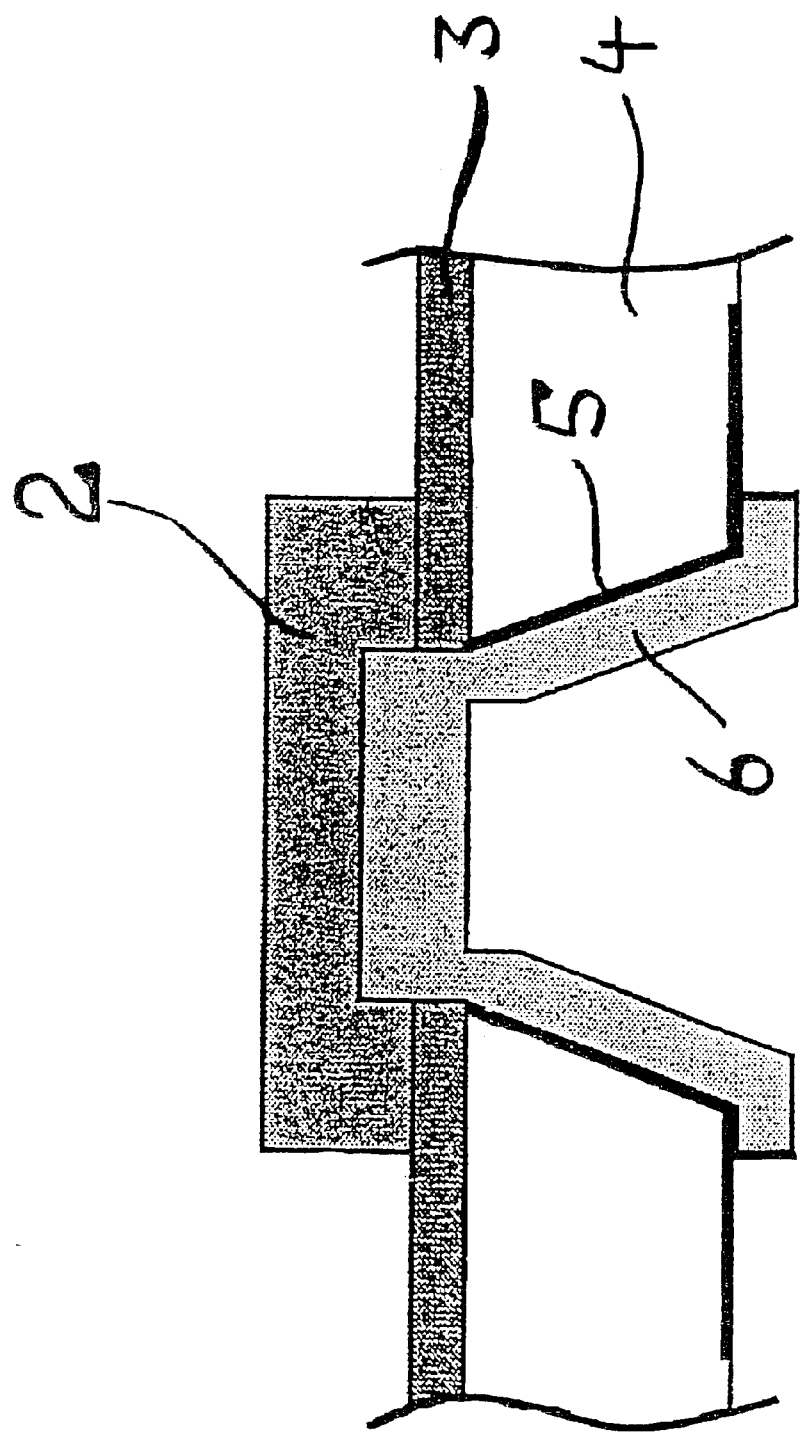
FIG. 1 is a component according to the invention.

FIG. 1 shows a component according to the invention in which a function element 2 is applied to a silicon substrate 4. Between the silicon substrate 4 and the function element there is an electrically insulating diamond layer 3 which serves as the seeding layer during the production of the component.

The function element 2 has an electrically active, doped layer, for example a $p^{++}$-layer (having quasi-metallic behaviour). This function element 2 is electrically contacted on its underside by a metallisation layer 6 formed from a contact metal such as, for example, WSi, WSi:N, Ti, Au. This metallisation layer 6 extends through an opening in the substrate 4 to the rear side of the function element 2. It is in turn electrically insulated from the silicon substrate 4 via a silicon dioxide layer 5. To produce this component, first of all the seeding layer 3 of diamond is deposited on a silicon substrate 4. Then the electrically active $p^{++}$-layer 2, doped with boron, is deposited on the seeding layer in the structure shown. The layer thicknesses are typically approx. 500 nm for the electrically active doped layer 2 and approx. 100 nm for the seeding layer 3. Thereafter, the opening is introduced in the rear side of the substrate 4. For this structuring of the rear side, first of all the opening in the silicon substrate 4 is etched by wet chemical anisotropic means in KOH. An $Si_3N_4$ mask was here used to structure this opening. Then the non-doped seeding layer 3 was etched down to a defined depth within the electrically active doped layer 2. This dry chemical etching took place in an $Ar/O_2$ plasma with an etching rate of approx. 350 nm/min and a depth of approx. 350 nm. Here, too, the structure was defined by means of a standard lithographic method.

As the next step, the silicon substrate 4 is insulated by oxidation or by sputter deposition of $SiO_2$ as the insulating layer 5. WSi, WSi:N, Ti and/or Au is then applied as a contact metal to this insulating layer 5 and to the doped, electrically active layer 2, from the rear side of the substrate 4, by sputter deposition and vapour deposition to form the contact metal layer.

The deposition of the diamond layers 3 and 2 took place in an MPECVD (Microwave Plasma Enhanced Chemical Vapour Deposition) system. The doping of the electrically active layer 2 takes place by means of a solid boron source. This is directly introduced in plasma for doping in the form of a wire for a period of approx. 2 hours during the deposition of layer 2. The doping substance concentration achieved is approx. $10^{20}$ $cm^{-3}$. In principle, however, the doping can also take place by implantation after the deposition of the diamond layer 2.

The component so applied can serve as a heating element for example in conjunction with a further rear side contact of this type. The function element 2 can, however, directly serve at the end of a catheter inserted into tissue to introduce currents of high intensity or high voltages locally into the tissue directly adjacent to layer 2.

Figure 2:
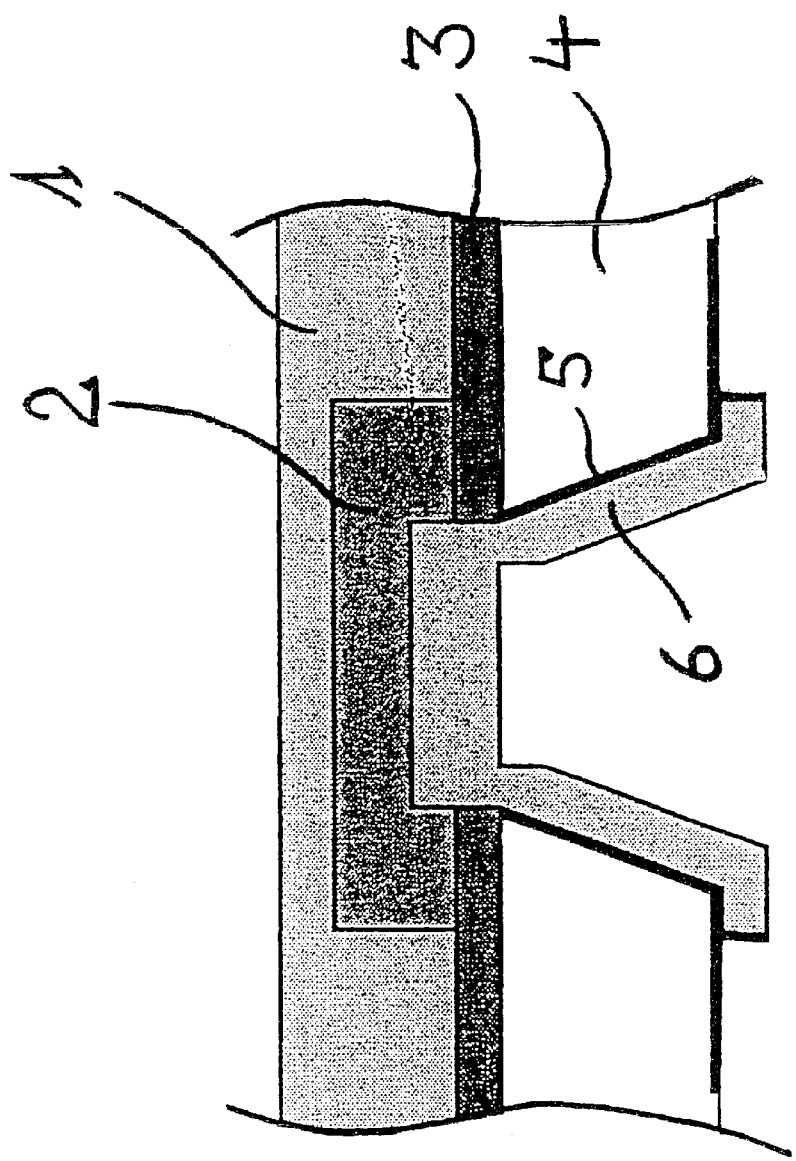
FIG. 2 is a component according to the invention.

FIG. 2 shows a further component according to the invention. The same constituent parts of the component are identified with the same reference numerals as in FIG. 1 and there is therefore no description of them in what follows. In addition to the component shown in FIG. 1, the electrically active doped layer of the function element is coated with a further diamond layer 1, which is nominally non-doped. This nominally non-doped layer has a thickness of up to 5 μm. Because of this diamond layer 1, the component becomes extremely resistant on its surface to chemical, physical or other influences. Since the component with diamond layer 1 only has a diamond layer with respect to the outer side, in particular the resistance to high temperature, the chemical stability and the lack of sensitivity to corpuscular radiation or hard X-rays can be exploited.

Figure 3:
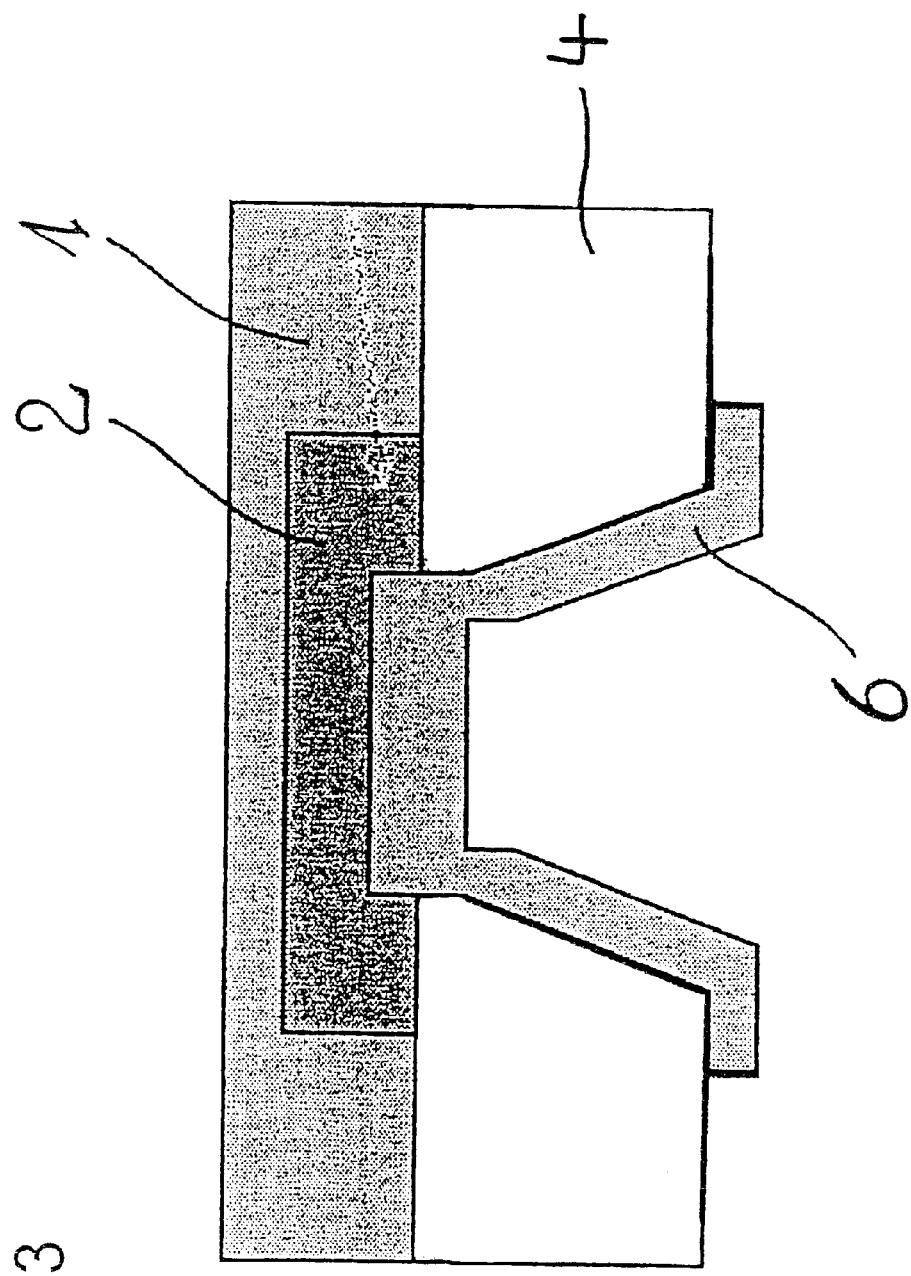
FIG. 3 is a further component according to the invention.

FIG. 3 shows a further component according to the invention in which the same reference numerals identify the same constituent parts as in FIG. 2. By contrast with FIG. 2, the substrate 4 does not consist of silicon but also of a diamond layer (diamond-quasi-substrate). Since diamond is completely non-conductive, the insulating layers 3 and 5 can be dispensed with. Nevertheless complete occlusion of all currents between the contact metal layer 6 and the electrically active doped layer 2 is guaranteed.

In all the figures, the electrically conductive layer 2 and the metal layer 6 produce the rear side contact for additional layers and function elements, or constituent parts of the function element, arranged on the front side of the component, to which further track conductors, lines or electrically conductive layers can be connected. The metal layer 6 is suitable as a soldering point on the rear side of the component.

What is claimed is:

1. Component which has a function element arranged on a substrate, the function element being electrically contacted in a contact region on its rear side facing the substrate, characterised in that the substrate has an opening in the contact region and the rear side of the function element and possibly the side walls of the opening are coated with a contact metal in the region of the opening.

2. Component according to claim 1, characterised in that the function element consists of a chemically inert material.

3. Component according to claim 1, characterised in that the function element has insulating and at least one of semi-conductive and quasi-metallic properties.

4. Component according claim 3, characterised in that the substrate is one of silicon, quartz, glass and diamond.

5. Component according to claim 1, characterised in that the function element has at least one of a conductive doped diamond layer in the region of the opening and consists entirely of diamond.

6. Component according to claim 1, characterised in that there is an electrically insulating layer between the substrate and the function element.

7. Component according to claim 1, characterised in that there is an electrically insulating layer between the substrate and the metallic coating.

8. Component according to claim 7 characterised in that the electrically insulating layer contains silicon oxides ($SiO_x$) or silicon nitride.

9. Component according to claim 1, characterised in that the front side of the component is completely coated with diamond.

10. Method of producing a component with a function element which is electrically contacted in a contact region on its rear side, characterised in that to form the function element on a substrate first of all an electrically conductive layer and thereafter possibly other layers necessary for forming the function element are deposited in the contact region, in the contact region the substrate is removed starting from the rear die of the substrate, and thereafter a contact metal is deposited in the contact region on the rear side, freed from the substrate, of the function element and possibly on the substrate.

11. Method according to claim 10, characterised in that the layers necessary for forming the function element are deposited at least partially or completely from a chemically inert material.

12. Method according to claim 10, characterised in that the substrate is removed completely.

13. Method according to claim 12, characterised in that, before the deposition of the layers of the function element, an electrically insulating layer is deposited on the front side of the substrate, or the front side of the substrate is so treated that it is electrically insulating.

14. Method according to claim 10, characterised in that, before the deposition of the contact metal on the rear side of the substrate in the contact region an electrically insulating layer is deposited, or the rear side of the substrate is so treated in the contact region that it is electrically insulating.

15. Method according to claim 13, characterised in that an insulator or a dielectric is deposited as the electrically insulating layer, or the substrate is oxidised.

16. Method according to claim 10, characterised in that the entire front side of the component is coated with diamond.

17. Method according to claim 10, characterised in that the coatings are applied by CVD, sputter deposition, vapour deposition or electrodeposition.

18. Method according to claim 10, characterised in that the substrate is removed in the contact region by an etching method.

19. Use of components according to claim 1 as sensors, actuators, active components, transistors, diodes, capacitors, resistors and the like.

20. Use according to claim 1 as sensors for pressure, impedance, temperature, in particular as sensors which are resistant to at least one of chemicals, corpuscular radiation, X-rays, high temperatures and magnetic fields.

21. Use according to claim 19 in medical technology, for instruments of micro-invasive surgery, catheters, NMR tomography and the like.

* * * * *